(12) United States Patent
Ishikawa

(10) Patent No.: US 12,484,147 B2
(45) Date of Patent: Nov. 25, 2025

(54) CIRCUIT BOARD

(71) Applicant: Murata Manufacturing Co., Ltd., Nagaokakyo (JP)

(72) Inventor: Kumiko Ishikawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 202 days.

(21) Appl. No.: 18/397,274

(22) Filed: Dec. 27, 2023

(65) Prior Publication Data
US 2024/0130042 A1    Apr. 18, 2024

Related U.S. Application Data

(63) Continuation of application No. PCT/JP2022/012155, filed on Mar. 17, 2022.

(30) Foreign Application Priority Data

Jul. 5, 2021    (JP) .................. 2021-111544

(51) Int. Cl.
*H05K 1/03*      (2006.01)
*H05K 1/11*      (2006.01)

(52) U.S. Cl.
CPC ........... *H05K 1/036* (2013.01); *H05K 1/0306* (2013.01); *H05K 1/115* (2013.01); *H05K 2201/09381* (2013.01); *H05K 2201/10909* (2013.01); *H05K 2201/10977* (2013.01)

(58) Field of Classification Search
CPC ................ H05K 1/036; H05K 1/0306; H05K 2201/09381; H05K 2201/10977
See application file for complete search history.

(56) References Cited

U.S. PATENT DOCUMENTS

| | | | | |
|---|---|---|---|---|
| 5,525,402 | A | * | 6/1996 | Nakamura .......... H01L 21/4853 |
| | | | | 428/209 |
| 6,300,576 | B1 | * | 10/2001 | Nakamura ........ H01L 23/49811 |
| | | | | 361/779 |
| 10,854,385 | B2 | * | 12/2020 | Ishikawa .................. H05K 3/40 |
| 2006/0118905 | A1 | | 6/2006 | Himori et al. |
| 2008/0283279 | A1 | | 11/2008 | Ogawa |
| 2020/0008301 | A1 | | 1/2020 | Kusuyama |
| 2020/0219652 | A1 | | 7/2020 | Ishikawa et al. |
| 2020/0365516 | A1 | | 11/2020 | Kasahara et al. |

FOREIGN PATENT DOCUMENTS

| | | |
|---|---|---|
| JP | H06-053655 A | 2/1994 |
| JP | H07-202422 A | 8/1995 |
| JP | 2004281744 A | 10/2004 |

(Continued)

OTHER PUBLICATIONS

International Search Report in PCT/JP2022/012155, mailed Jun. 7, 2022, 3 pages.

*Primary Examiner* — Sherman Ng
(74) *Attorney, Agent, or Firm* — ArentFox Schiff LLP

(57) ABSTRACT

A circuit board that includes a ceramic substrate; a protruding electrode on a surface of the ceramic substrate; and a protective layer containing a metal oxide and covering at least a portion of a lateral surface of the protruding electrode and extending continuously across a boundary between the portion of the lateral surface of the protruding electrode and the surface of the ceramic substrate.

14 Claims, 8 Drawing Sheets

(56) References Cited

FOREIGN PATENT DOCUMENTS

| | | | |
|---|---|---|---|
| JP | 2005166873 | A | 6/2005 |
| JP | 2005-197663 | A | 7/2005 |
| JP | 2007311596 | A | 11/2007 |
| JP | 2007324429 | A | 12/2007 |
| JP | 4111239 | B2 | 7/2008 |
| JP | 2017079237 | A | 4/2017 |
| JP | 2020188127 | A | 11/2020 |
| WO | 2018168709 | A1 | 9/2018 |
| WO | 2019059017 | A1 | 3/2019 |

\* cited by examiner

CIRCUIT BOARD

CROSS REFERENCE TO RELATED APPLICATIONS

The present application is a continuation of International application No. PCT/JP2022/012155, filed Mar. 17, 2022, which claims priority to Japanese Patent Application No. 2021-111544, filed Jul. 5, 2021, the entire contents of each of which are incorporated herein by reference.

TECHNICAL FIELD

The present invention relates to a circuit board.

BACKGROUND ART

Examples of boards include one including a substrate, an electronic component mounted on the substrate, and protruding electrodes surrounding a portion where the electronic component is mounted on the substrate.

For example, WO 2018/168709 (hereinafter "Patent Literature 1") discloses a circuit module including a substrate provided with an electrode base, and a metal column directly connected to the electrode base, wherein a plating layer is formed at a periphery of the metal column.

SUMMARY OF INVENTION

However, in the circuit module shown in Patent Literature 1, the bondability was insufficient between the metal column as the protruding electrode and the substrate. Specifically, the metal column was separated from the substrate or cracking occurred at a bonding portion between the metal column and the substrate in some cases.

The present invention was made to solve the above issue and aims to provide a circuit board capable of improving the bondability between the substrate and the protruding electrode.

The circuit board of the present invention includes a ceramic substrate; a protruding electrode on a surface of the ceramic substrate; and a protective layer containing a metal oxide and covering at least a portion of a lateral surface of the protruding electrode and extending continuously across a boundary between the portion of the lateral surface of the protruding electrode and the surface of the ceramic substrate.

The present invention provides a circuit board capable of improving the bondability between the substrate and the protruding electrode.

DETAILED DESCRIPTION OF THE PREFERRED EMBODIMENTS

The circuit board of the present invention is described below. The present invention is not limited to the following preferred embodiments, and may be suitably modified without departing from the gist of the present invention. Combinations of two or more preferred features described in the following preferred features are also within the scope of the present invention.

Circuit Board

The circuit board of the present invention includes a ceramic substrate; a protruding electrode on a surface of the ceramic substrate; and a protective layer containing a metal oxide and covering at least a portion of a lateral surface of the protruding electrode and extending continuously across a boundary between the portion of the lateral surface of the protruding electrode and the surface of the ceramic substrate.

Figure 1:
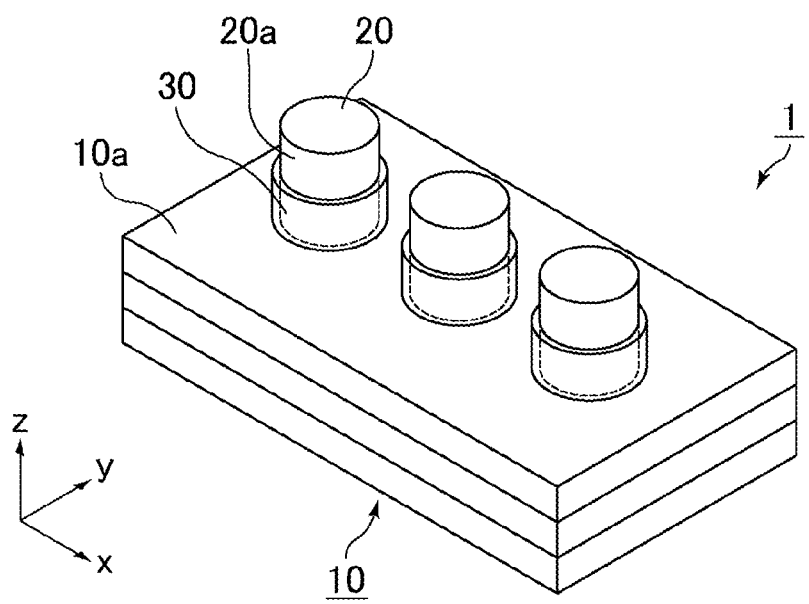
FIG. 1 is a schematic perspective view showing an example of a circuit board of Embodiment 1.
Figure 2:
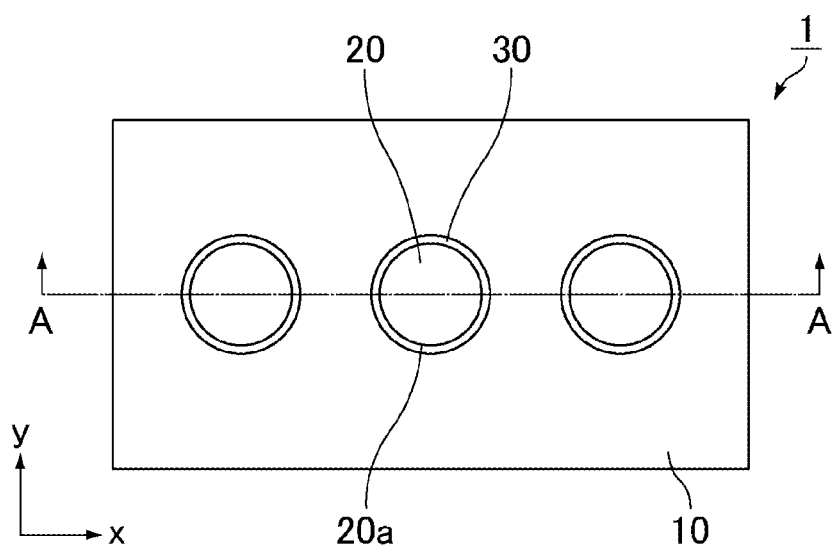
FIG. 2 is a top view of the circuit board shown in FIG. 1.
Figure 3:
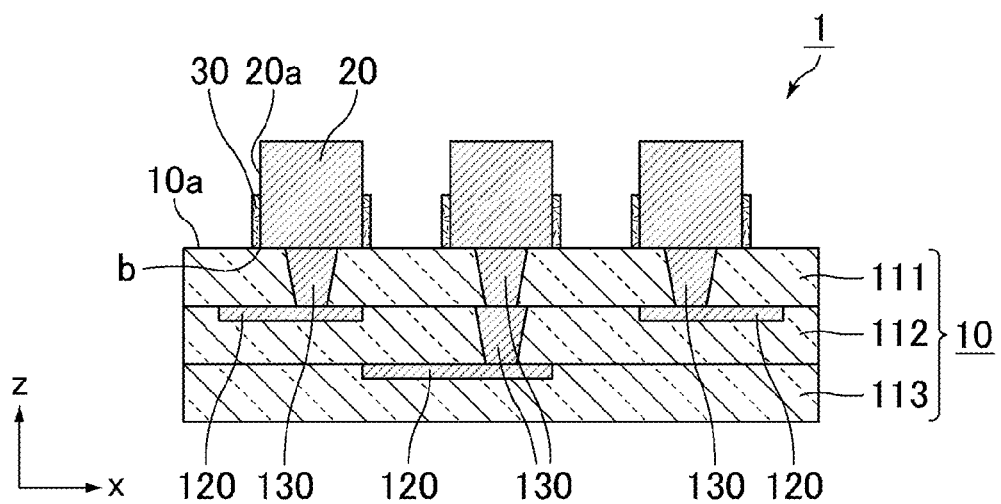
FIG. 3 is a cross-sectional view taken along line A-A in FIG. 2.

FIG. 1 is a schematic perspective view showing an example of a circuit board of Embodiment 1. FIG. 2 is a top view of the circuit board shown in FIG. 1. FIG. 3 is a cross-sectional view taken along line A-A in FIG. 2.

A circuit board 1 shown in FIG. 1 includes a ceramic substrate 10, protruding electrodes 20, and protective layers 30.

The protruding electrodes 20 are formed on a surface 10a of the ceramic substrate 10.

The protruding electrodes 20 protrude from the surface 10a of the ceramic substrate 10 in a thickness direction of the ceramic substrate 10 (the direction indicated by an arrow "z" in FIG. 1).

As shown in FIG. 1, at least a portion of a lateral surface 20a of each protruding electrode 20 is covered with the protective layer 30.

As shown in FIG. 2, each protruding electrode 20 has a cylindrical shape with a circular top-view shape.

Each protective layer 30 entirely covers the lateral surface 20a of the protruding electrode 20 when seen in the top view.

As shown in FIG. 3, each protective layer 30 extends continuously across a boundary "b" between the lateral surface 20a of the protruding electrodes 20 and the surface 10a of the ceramic substrate 10.

Each protective layer 30 extends continuously across the boundary "b" between the lateral surface 20a of the protruding electrodes 20 and the surface 10a of the ceramic substrate 10, so that each protective layer 30 can increase the bondability between the protruding electrodes 20 and the ceramic substrate 10. Thus, the separation of the protruding electrodes 20 can be prevented.

As shown in FIG. 3, the ceramic substrate 10 includes multiple insulating layers 111, 112, and 113, internal wiring lines 120, and via conductors 130.

The protruding electrodes 20 are electrically connected to the internal wiring lines 120 via the via conductors 130.

The protruding electrodes 20 may be directly connected to the internal wiring lines 120.

(Ceramic Substrate)

The ceramic substrate includes an insulating layer containing a ceramic material.

The ceramic substrate may include multiple insulating layers.

The ceramic material of the ceramic substrate may be a low temperature co-fired ceramic material.

The term "low temperature co-fired ceramic material" means a ceramic material that can be sintered at a firing temperature of 1000° C. or lower and that can be co-fired with silver or copper that are suitably used as a metal material to be formed into an internal wiring line.

Preferred examples of the low temperature co-fired ceramic material include $SiO_2$—$CaO$—$Al_2O_3$—$B_2O_3$-based glass ceramic and $SiO_2$—$MgO$—$Al_2O_3$—$B_2O_3$-based glass ceramic.

The ceramic substrate includes internal wiring lines.

Examples of materials of the internal wiring lines include Cu, Ag, Al, Fe, Cr, Ni, Au, and alloys containing at least one of these metals. A preferred material is one capable of being co-fired with the low temperature co-fired ceramic material.

(Protruding Electrode)

The protruding electrode is formed on the surface of the ceramic substrate.

The protruding electrode may be connected directly or through a via conductor to an internal wiring line defining the ceramic substrate.

The protruding electrode has a pillar shape such as a cylindrical shape, an elliptical cylinder shape, or a polygonal prism shape.

The shape of the protruding electrode is not limited, but is preferably 50 µm to 300 µm in height and 100 µm to 300 µm in diameter.

The terms "height of the protruding electrode" means the height from the surface of the ceramic substrate. The term "diameter of the protruding electrode" means the diameter (equivalent circle diameter) of a circle having the same area as the area (projected area) of the protruding electrode when seen in the top view.

The aspect ratio (height/equivalent circle diameter) of the protruding electrode is not limited, but is preferably 0.5 to 1.5.

Examples of materials of the protruding electrode include Cu, Ag, Al, Fe, Cr, Ni, Au, and alloys containing at least one of these metals.

The protruding electrode may contain a sintered metal which is a sintered body of a metal powder made of any of the above metals.

Preferably, the protruding electrode contains at least one metal selected from the group consisting of Cu, Ag, and Ni.

The protruding electrode containing any of these metals has good conductivity.

The ceramic substrate may include multiple protruding electrodes.

The multiple protruding electrodes may have the same shape or different shapes.

(Protective Layer)

The protective layer contains a metal oxide.

The protective layer containing a metal oxide is different from a plating film formed by plating.

Preferably, the protective layer contains a metal oxide of at least one metal element selected from the group consisting of Al, Zr, Ti, Si, Zn, and Mg.

The protective layer containing the metal oxide increases the bonding strength between the ceramic substrate and the protruding electrode, making it possible to prevent or reduce separation and cracking.

Preferably, the protective layer contains $SiO_2$ as a main component.

The protective layer containing $SiO_2$ as a main component has a high affinity with a ceramic material of the ceramic substrate. Thus, the protective layer increases the bonding strength between the ceramic substrate and the protruding electrode, making it possible to prevent or reduce separation and cracking.

The term "main component" as used herein refers to a component whose amount (weight percentage) in the protective layer is the largest.

Preferably, the protective layer contains the ceramic material of the ceramic substrate.

The protective layer containing a ceramic material increases the bonding strength between the protective layer and the ceramic substrate, so that the protective layer increases the bonding strength to bond between the ceramic substrate and the protruding electrode, which can further prevent or reduce separation and cracking.

Preferably, the protective layer contains a low temperature co-fired ceramic material similar to the one contained in the ceramic substrate. Preferred examples of the low temperature co-fired ceramic material include $SiO_2$—$B_2O_3$—$K_2O$-based glass ceramic, $SiO_2$—$B_2O_3$—$K_2O$—$ZrO$-based glass ceramic, $SiO_2$—$B_2O_3$—$ZnO$—$Al_2O_3$-based glass ceramic, $SiO_2$—$B_2O_3$—$Al_2O_3$—$CaO$—$SrO$-based glass ceramic, $SiO_2$—$BaO$—$CaO$—$SrO$-based glass ceramic, $SiO_2$—$BaO$—$Al_2O_3$—$TiO_2$-based glass ceramic, $SiO_2$—$CaO$—$Al_2O_3$—$B_2O_3$-based glass ceramic, $SiO_2$—$MgO$—$Al_2O_3$—$B_2O_3$-based glass ceramic, and $Al_2O_3$—$CaO$—$SiO_2$—$MgO$—$B_2O_3$-based glass ceramic.

The thickness of the protective layer is not limited, but is preferably 10 µm or more.

The height of the protective layer from the surface of the ceramic substrate (hereinafter, also simply referred to as "the height of the protective layer") is not limited, but is preferably 15 µm or more.

The thickness and the height of the protective layer are measured by the following methods. First, the circuit board is sealed with a mold resin or the like, and then the circuit board is cut through the center of gravity of the protruding electrode when the protruding electrode is seen in the top view and also along a plane in the thickness direction (the direction in which the protruding electrode protrudes). The cross section is observed under a metal microscope, a scanning electron microscope (SEM), a scanning electron microscope-energy dispersive X-ray spectroscopy (SEM-EDX), or the like to measure the thickness of the protective layer at a point whose height from the surface of the ceramic substrate is the same as the reference height, and the height of the protective layer from the surface of the ceramic substrate.

The thickness and the height of the protective layer are described with reference to FIG. 4.

Figure 4:
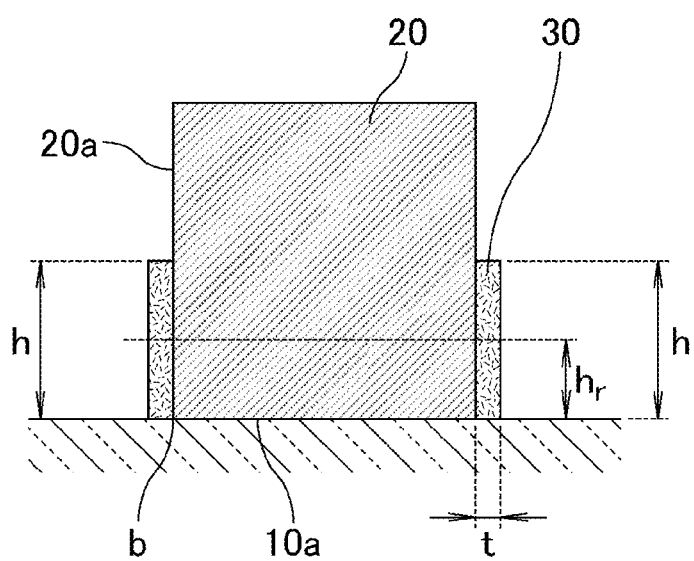
FIG. 4 is a schematic view showing the thickness and the height of a protective layer.

FIG. 4 is a schematic view showing the thickness and the height of the protective layer.

The height of the protective layer 30 from the surface 10a of the ceramic substrate 10 is the length indicated with a double-headed arrow "h".

The thickness of the protective layer 30 is the thickness (length indicated with a double-headed arrow "t") of the protective layer 30 at a reference height "$h_r$".

The reference height h r is 3 µm.

When the height of the protective layer is less than 3 µm, a half the height of the protective layer is regarded as the reference height.

Preferably, the coverage rate of the protective layer on the lateral surface of the protruding electrode is 50% or more.

The coverage rate of the protective layer on the lateral surface of the protruding electrode is measured by the following method. First, the circuit board is sealed with a mold resin or the like, and then the surface provided with the protruding electrode is ground to expose a point whose height from the surface of the ceramic substrate is the same as the reference height. On the exposed cross section, the outer perimeter of the protruding electrode and the length of the protective layer are determined, and the length of the protective layer is divided by the outer perimeter of the protruding electrode, whereby the coverage rate is determined.

In the circuit board of the present invention, preferably, the protective layer has a thickness of 10 µm or more, a height of 15 µm or more from the surface of the ceramic substrate, and a coverage rate of 50% or more on the lateral surface of the protruding electrode.

The separation and cracking of the protruding electrode can be further prevented or reduced when all these three characteristics are met.

The coverage rate of the protective layer on the lateral surface of the protruding electrode is described with reference to FIG. 5 to FIG. 10.

Figure 5:
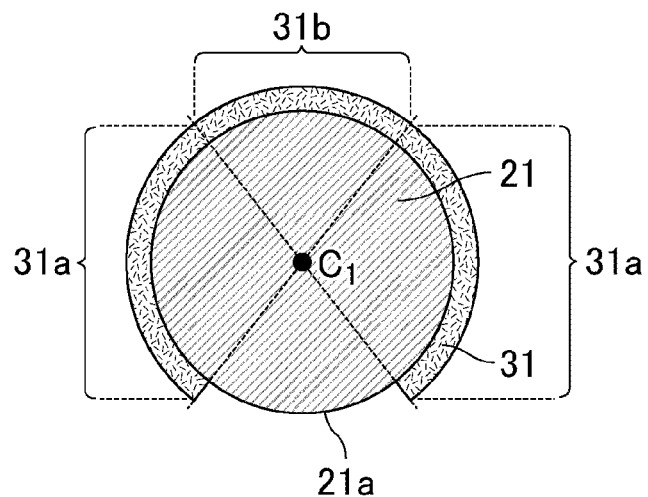
FIG. 5 is an enlarged cross-sectional view of and around a protruding electrode on a circuit board of Embodiment 2 at a reference height.

FIG. 5 is an enlarged cross-sectional view of and around a protruding electrode on a circuit board of Embodiment 2 at the reference height.

A protruding electrode 21 shown in FIG. 5 has a circular cross-sectional shape.

A portion of a lateral surface 21a of the protruding electrode 21 shown in FIG. 5 is covered with protective layers 31.

Within the lateral surface 21a of the protruding electrode 21, the length of the region provided with the protective layers 31 is 79.2% of the length of the lateral surface 21a of the protruding electrode 21. Thus, the protruding electrode 21 shown in FIG. 5 has a coverage rate of 79.2%.

Figure 6:
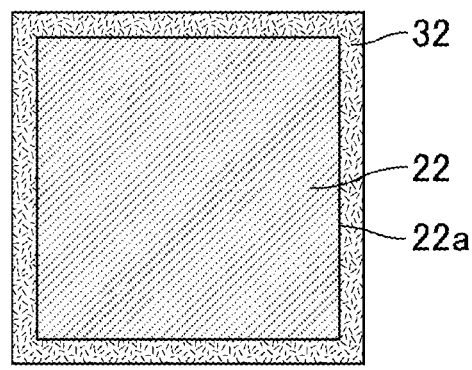
FIG. 6 is an enlarged cross-sectional view of and around a protruding electrode of a circuit board of Embodiment 3 at a reference height.

FIG. 6 is an enlarged cross-sectional view of and around a protruding electrode of a circuit board of Embodiment 3 at the reference height.

A protruding electrode 22 shown in FIG. 6 has a square cross-sectional shape.

Protective layers 32 entirely cover lateral surfaces 22a of the protruding electrode 22. Thus, the protruding electrode 22 shown in FIG. 6 has a coverage rate of 100%.

Figure 7:
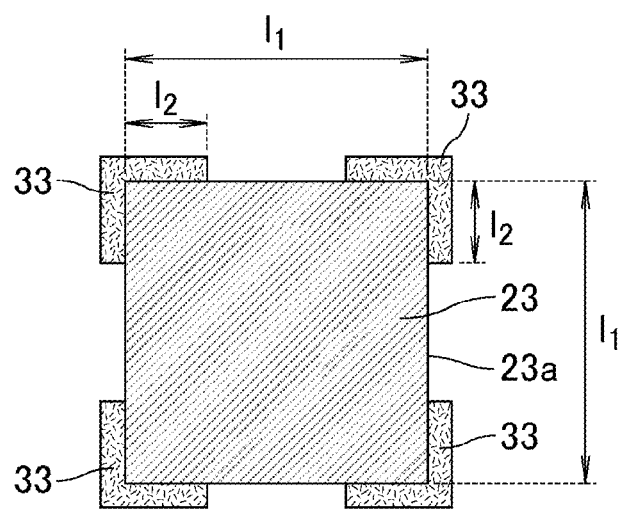
FIG. 7 is an enlarged cross-sectional view of and around a protruding electrode of a circuit board of Embodiment 4 at a reference height.

FIG. 7 is an enlarged cross-sectional view of and around a protruding electrode of a circuit board of Embodiment 4 at the reference height.

A protruding electrode 23 shown in FIG. 7 has a square cross-sectional shape.

Protective layers 33 on lateral surfaces 23a of the protruding electrode 23 each cover a portion corresponding to a corner of the square.

With respect to a length "$l_1$" of each side of the square, each protective layer 33 covers a length "$l_2$" from the corner on the corresponding side. Thus, the coverage rate of a protruding electrode 23 shown in FIG. 7 is expressed as follows: $(8 \times l_2)/(4 \times l_1) \times 100(\%)$.

Figure 8:
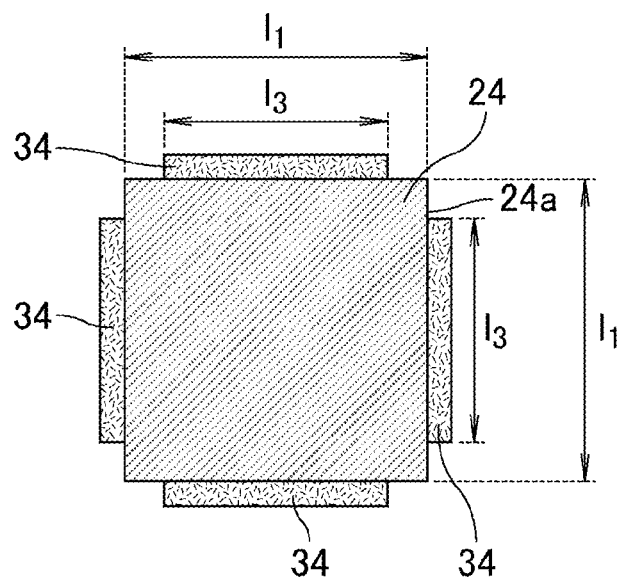
FIG. 8 is an enlarged cross-sectional view of and around a protruding electrode of a circuit board of Embodiment 5 at a reference height.

FIG. 8 is an enlarged cross-sectional view of and around a protruding electrode of a circuit board of Embodiment 5 at the reference height.

A protruding electrode 24 shown in FIG. 8 has a square cross-sectional shape.

Protective layers 34 on lateral surfaces 24a of the protruding electrode 24 each partially cover a portion corresponding to a side of the square.

With respect to a length "$l_1$" of each side of the square, each protective layer 34 covers a length "$l_3$" on the corresponding side. Thus, the coverage rate of the protruding electrode 24 shown in FIG. 8 is expressed as follows: $(4 \times l_3)/(4 \times l_1) \times 100(\%)$.

Figure 9:
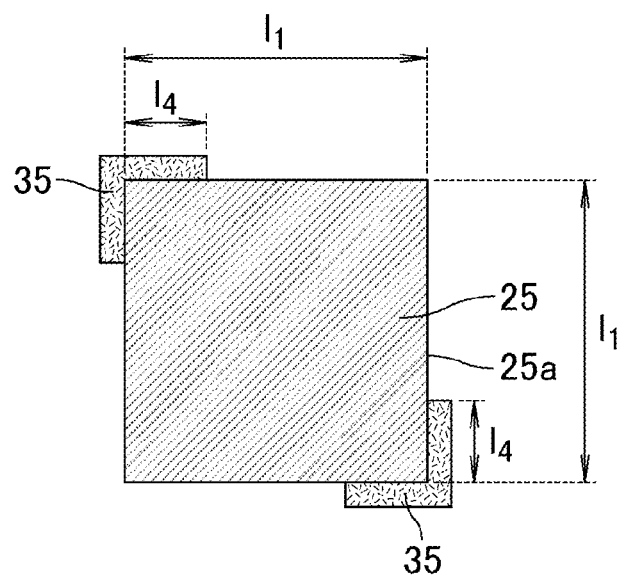
FIG. 9 is an enlarged cross-sectional view of and around a protruding electrode of a circuit board of Embodiment 6 at a reference height.

FIG. 9 is an enlarged cross-sectional view of and around a protruding electrode of a circuit board of Embodiment 6 at the reference height.

A protruding electrode 25 shown in FIG. 9 has a square cross-sectional shape.

Protective layers 35 on lateral surfaces 25a of the protruding electrode 25 cover two diagonally opposite corners of the square.

With respect to a length "$l_1$" of each side of the square, each protective layer 35 covers a length "$l_4$" from the corner on the corresponding side. Thus, the coverage rate of the protruding electrode 25 shown in FIG. 9 is expressed as follows: $(4 \times l_4)/(4 \times l_1) \times 100(\%)$.

Figure 10:
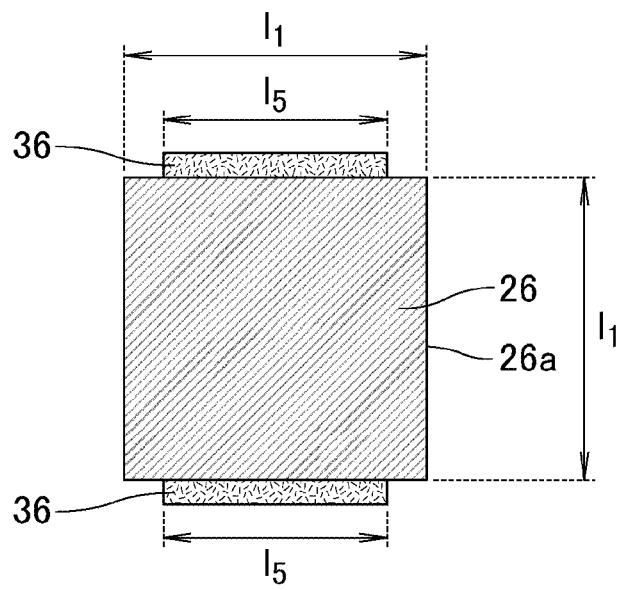
FIG. 10 is an enlarged cross-sectional view of and around a protruding electrode of a circuit board of Embodiment 7 at a reference height.

FIG. 10 is an enlarged cross-sectional view of and around a protruding electrode of a circuit board of Embodiment 7 at the reference height.

A protruding electrode 26 shown in FIG. 10 has a square cross-sectional shape.

Protective layers 36 on lateral surfaces 26a of the protruding electrode 26 partially cover two opposite sides of the square.

With respect to a length "$l_1$" of each side of the square, each protective layer 36 on two sides covers a length "$l_5$" on the corresponding side. Thus, the coverage rate of the protruding electrode 26 shown in FIG. 10 is expressed as follows: $(2 \times l_5)/(4 \times l_1) \times 100(\%)$.

In the circuit board of the present invention, preferably, the protective layers covering the lateral surfaces of the protruding electrode are highly symmetric to each other.

In view of a cross section of the circuit board cut at the reference height, the symmetry is high when the protective layers are provided at opposite portions across the center of gravity which is determined from the external shape of the protruding electrode.

For example, in the protruding electrodes shown in FIG. 6, FIG. 7, FIG. 8, FIG. 9, and FIG. 10, the protective layers are entirely opposite to each other across the center of gravity (not shown) of the cross-sectional shape of the protruding electrode, so that these protective layers are highly symmetric to each other. In contrast, in the protruding electrode shown in FIG. 5, while protective layers 31a among the protective layers 31 are opposite to each other across the center of gravity $C_1$, a protective layer 31b is not opposite to another protective layer across the center of gravity $C_1$.

When the protruding electrode 22, the protruding electrode 23, the protruding electrode 24, the protruding electrode 25, and the protruding electrode 26 respectively shown FIG. 6, FIG. 7, FIG. 8, FIG. 9, and FIG. 10 are compared with the protruding electrode 21 shown in FIG. 5, the symmetry is high in the protruding electrode 22, the protruding electrode 23, the protruding electrode 24, the protruding electrode 25, and the protruding electrode 26 respectively shown FIG. 6, FIG. 7, FIG. 8, FIG. 9, and FIG. 10 in which there is no portion where the protective layers are not opposite to each other across the center of gravity.

In the circuit board of the present invention, preferably, at least a portion of the surface of the ceramic substrate on which the protruding electrode is formed is covered with a mold resin.

The protruding electrode can be protected when the surface of the ceramic substrate on which the protruding electrode is formed is covered with a mold resin.

Preferably, the mold resin covers the entire surface of the ceramic substrate on which the protruding electrode is formed.

Preferably, the height of the mold resin is the same as the height of the protruding electrode. Here, preferably, a plating film is on the top surface of the protruding electrode.

The term "top surface of the protruding electrode" refers to a surface other than the lateral surface(s) of the protruding electrode, which is a surface on the side opposite to the side where the protruding electrode is in contact with the ceramic substrate.

The plating film can be formed by plating the top surface of the protruding electrode, for example.

The thickness of the plating film is not limited, but is preferably 5 μm to 15 μm.

Examples of materials of the plating film include Cu, Ag, Ni, Sn, Zn, and Au.

The mold resin may be an epoxy resin, an acrylic resin, a silicone resin, or the like.

The mold resin may further contain a filler.

An example of the circuit board provided with the mold resin is described with reference to FIG. 11 and FIG. 12.

Figure 11:
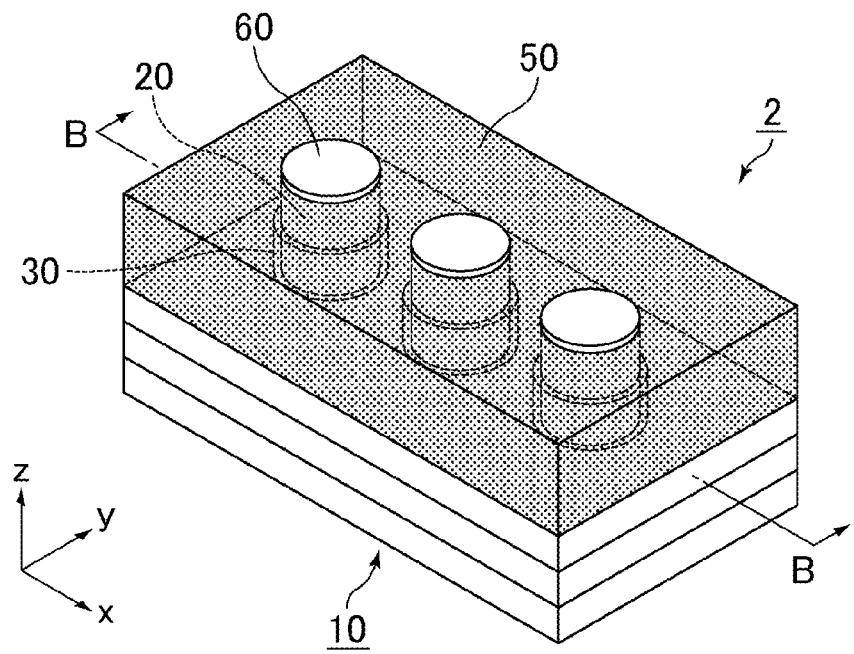
FIG. 11 is a schematic perspective view showing an example of a circuit board of Embodiment 8.

FIG. 11 is a schematic perspective view showing an example of a circuit board of Embodiment 8. FIG. 12 is a cross-sectional view taken along line B-B in FIG. 11.

Figure 12:
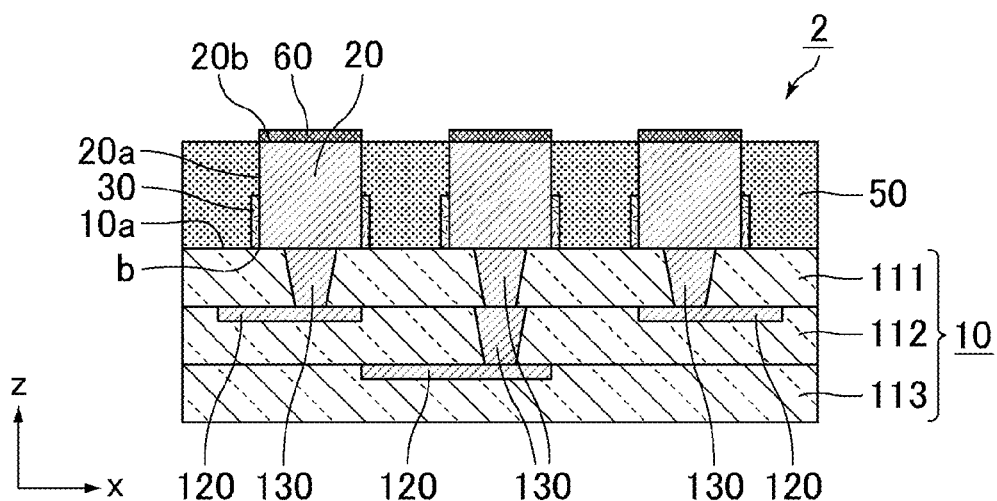
FIG. 12 is a cross-sectional view taken along line B-B in FIG. 11.

A circuit board 2 shown in FIG. 11 and FIG. 12 includes the ceramic substrate 10, the protruding electrodes 20, the protective layers 30, a mold resin 50, and plating films 60.

The circuit board 2 shown in FIG. 11 and FIG. 12 has the same configuration as that of the circuit board 1 shown in FIG. 1, FIG. 2, and FIG. 3, except that the surface 10a of the ceramic substrate 10 is covered with the mold resin 50 and that the plating film 60 is on a top surface 20b of each protruding electrode 20.

As shown in FIG. 12, the height of the mold resin 50 is the same as the height of each protruding electrode 20.

The plating film 60 is on the top surface 20b of each protruding electrode 20, and thus protrudes from the mold resin 50.

When the plating film 60 protrudes from the mold resin 50, the connectivity is good between the circuit board 2 and other electronic components at the time of connection.

Method of Producing Circuit Board

The circuit board of the present invention is obtained, for example, by adding an additive to a conductive paste in a method including: stacking a constraining layer sheet on a surface of a ceramic green sheet laminate (a laminate of ceramic green sheets) to be formed into a ceramic substrate; forming a through hole in the constraining layer sheet stacked; filling the through hole with a conductive paste (also referred to as the "protruding electrode paste") to be formed into a protruding electrode when fired; firing the laminate; and removing the constraining layer sheet by washing after firing.

An example of the method of producing the circuit board of the present invention is described with reference to FIG. 13 to FIG. 17.

Figure 13:
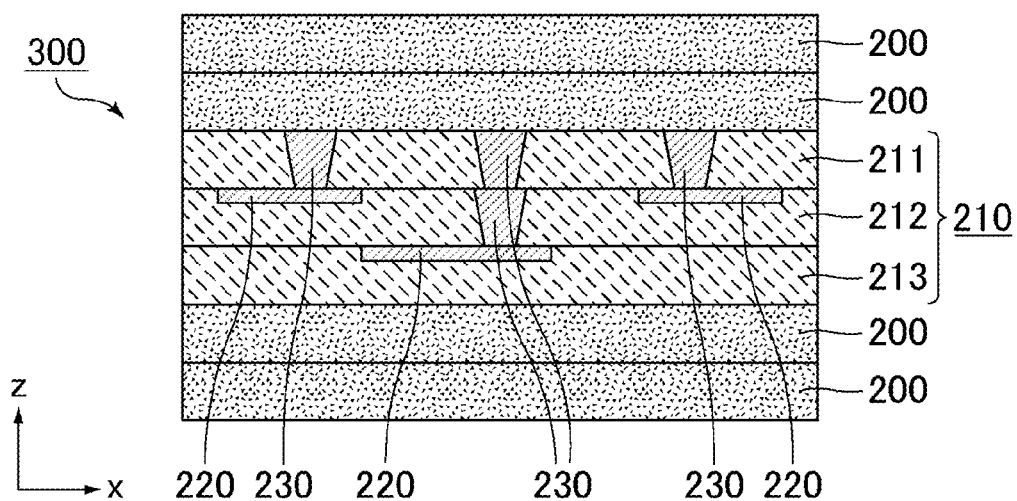
FIG. 13 is a schematic view showing an example of a step of stacking constraining layer sheets on a ceramic green sheet laminate.
Figure 14:
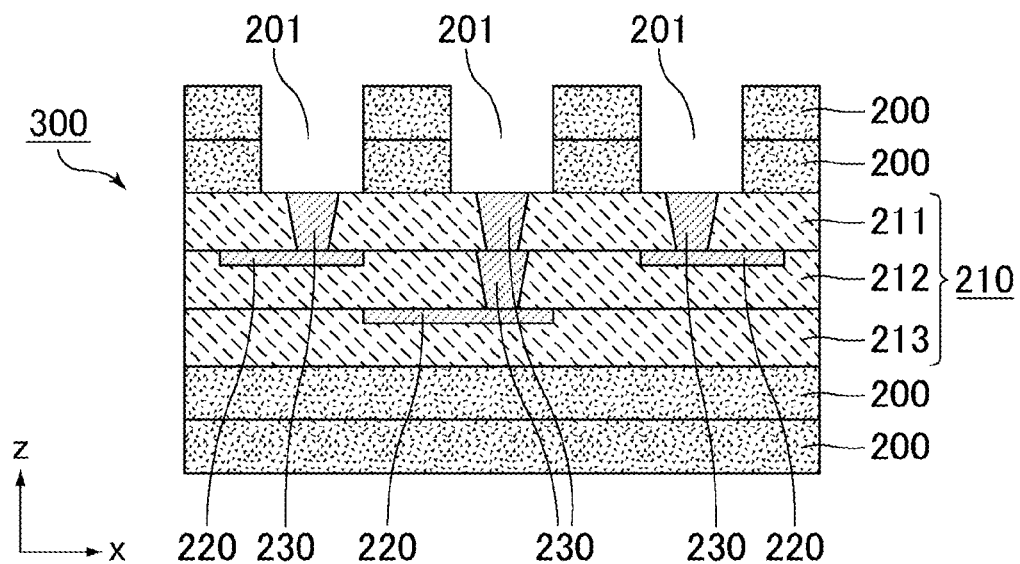
FIG. 14 is a schematic view showing an example of a step of forming through holes in the constraining layer sheets.
Figure 15:
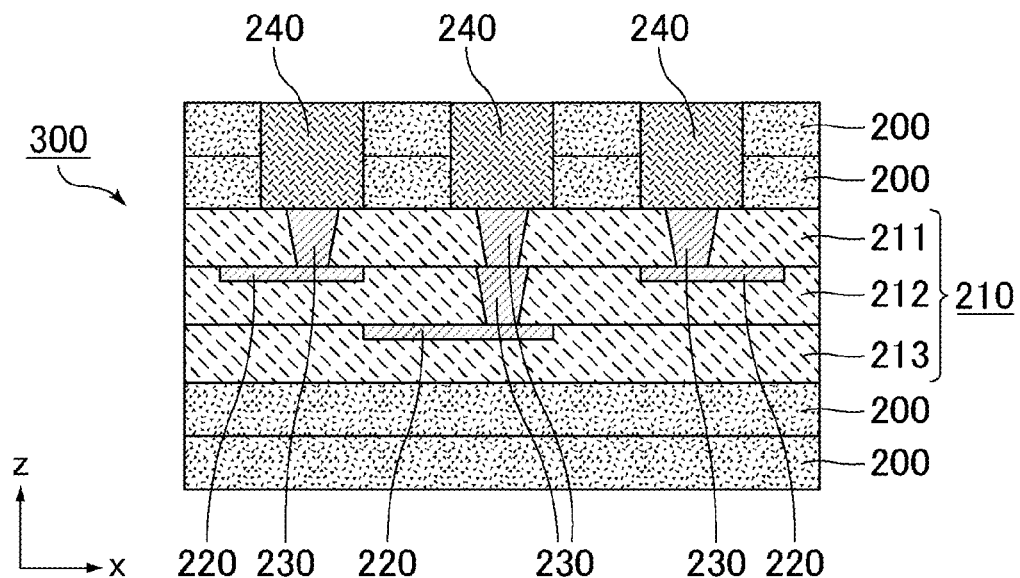
FIG. 15 is a schematic view showing an example of a step of filling the through holes with a conductive paste to be formed into protruding electrodes.
Figure 16:
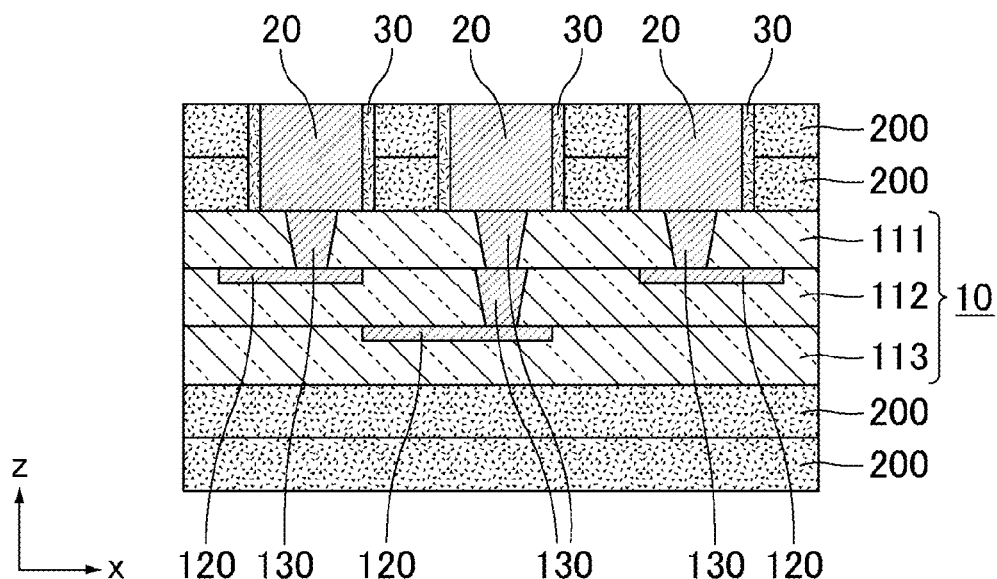
FIG. 16 is a schematic view showing an example of a step of firing the laminate.
Figure 17:
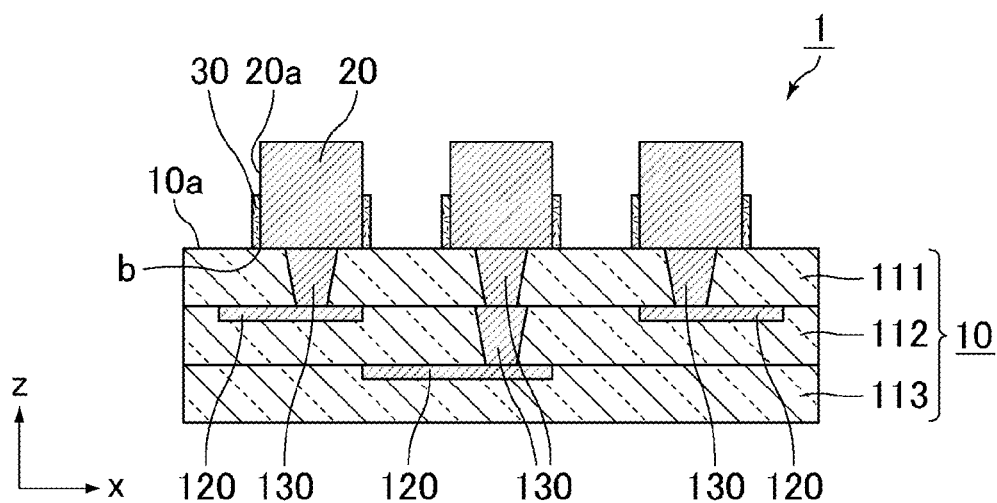
FIG. 17 is a schematic view showing an example of a step of washing the laminate after firing.

FIG. 13 is a schematic view showing an example of a step of stacking constraining layer sheets on the ceramic green sheet laminate. FIG. 14 is a schematic view showing an example of a step of forming through holes in the constraining layer sheets. FIG. 15 is a schematic view showing an example of a step of filling the through holes with a conductive paste to be formed into protruding electrodes. FIG. 16 is a schematic view showing an example of a step of firing the laminate. FIG. 17 is a schematic view showing an example of a step of washing the laminate after firing.

First, as shown in FIG. 13, two constraining layer sheets 200 are stacked on both surfaces of a ceramic green sheet laminate 210 of ceramic green sheets 211, 212, and 213 which is formed into a ceramic substrate. Thus, a laminate 300 is prepared.

The ceramic green sheet laminate 210 is provided with a conductive paste 220 to be formed into internal wiring lines and a conductive paste 230 to be formed into via conductors when fired.

The number of the constraining layer sheets 200 defining the laminate 300 is not limited. The height of the protruding electrode to be formed is determined by the total thickness of the constraining layer sheets 200 stacked on a surface where the conductive paste 230 to be formed into via conductors is exposed, among the surfaces of the ceramic green sheet laminate 210. Thus, the thickness of the constraining layer sheets and the number thereof to be stacked may be suitably adjusted according to the height of the protruding electrode intended to be formed.

The total thickness of the constraining layer sheets 200 on a surface where no conductive paste 230 to be formed into via conductors is exposed, among the surfaces of the ceramic green sheet laminate 210, is preferably the same as but may be different from the total thickness of the constraining layer sheets 200 on a surface where the conductive paste 230 is exposed. No constraining layer sheets may be provided on the surface where no conductive paste 230 to be formed into via conductors is exposed, among the surfaces of the ceramic green sheet laminate 210.

Subsequently, as shown in FIG. 14 and FIG. 15, through holes 201 are formed in the constraining layer sheets 200 on the top side, and the through holes 201 are filled with a protruding electrode paste 240. When forming the through holes 201, the positions of the through holes 201 are adjusted such that the protruding electrode paste 240 is in contact with the conductive paste 230 to be formed into via conductors. The through holes 201 may be formed in the constraining layer sheets 200 and filled with the protruding electrode paste 240 before stacking the constraining layer sheets 200 on the ceramic green sheet laminate 210.

Then, the laminate 300 is fired, whereby the ceramic green sheets 211, 212, and 213 are formed into the insulating layers 111, 112, and 113, respectively, as shown in FIG. 16, and the conductive paste 220 to be formed into internal wiring lines and the conductive paste 230 to be formed into via conductors are formed into the internal wiring lines 120 and the via conductors 130. Further, the protruding electrode paste 240 is formed into the protruding electrodes 20. Here, components of the additive in the protruding electrode paste 240 are diffused into the constraining layer sheets 200, whereby portions of the constraining layer sheet 200 are formed into the protective layers 30.

Lastly, as shown in FIG. 17, the constraining layer sheets 200 are removed by washing, whereby the circuit board 1 shown in FIG. 3 is obtained.

The protective layers 30 formed by diffusion of the components of the additive into the constraining layer sheets 200 are more resistant to washing than the constraining layer sheets 200 where no components of the additive are diffused. This makes it possible to remove the constraining layer sheets 200 by washing and retain the protective layers 30. Here, each protective layer is more easily removed at a portion closer to the tip end of the protruding electrode, so that the protective layer formed on a portion of the lateral surface of the protruding electrode, which is closer to the tip end of the protruding electrode, is easily removed by washing. In contrast, the protective layer formed across a boundary between the lateral surface of the protruding electrode and the surface of the ceramic substrate is not easily removed by washing because the boundary is far from the tip end of the protruding electrode. The thickness and the coverage rate of each protective layer 30 can be adjusted by controlling the washing conditions.

In this method, the protruding electrodes and the protective layers are formed at the same time, so that there is no protruding electrode without a protective layer formed thereon. Thus, there is no need to protect a protruding electrode without a protective layer formed thereon from impact, which is preferred in terms of process control.

The constraining layer sheets may be removed by a method such as washing using a washing liquid.

The washing liquid may be a washing liquid containing ceramic abrasive grains and water, for example.

Examples of the ceramic abrasive grains include alumina abrasive grains, zirconia abrasive grains, and glass abrasive grains.

The protruding electrode paste contains at least a conductor powder and a binder.

Preferably, the conductor powder is a metal powder of at least one metal selected from Cu, Ag, Al, Fe, Cr, Ni, and Au or a metal powder of an alloy containing at least one of these metals, or the like.

Examples of the binder include terpineol solvent-based binders containing an ethyl cellulose resin.

The additive added to the protruding electrode paste reacts with the constraining layer sheets during firing, whereby the protective layers are formed.

Preferably, the additive includes, for example, at least one metal element selected from the group consisting of Zr, Ti, Si, Zn, and Mg.

Examples of the additive include $SiO_2$—$B_2O_3$—$K_2O$-based glass, $SiO_2$—BaO—$Al_2O_3$—$TiO_2$-based glass, $SiO_2$—BaO—CaO—SrO-based glass, $SiO_2$—$B_2O_3$—$Al_2O_3$—CaO—SrO-based glass, $Al_2O_3$—CaO—$SiO_2$—MgO—$B_2O_3$-based glass, $SiO_2$—$B_2O_3$—$K_2O$—ZrO-based glass, and $SiO_2$—$B_2O_3$—ZnO—$Al_2O_3$-based glass.

Preferably, the amount of the additive in the protruding electrode paste is 0.1 to 15 wt %.

In addition to the method described above, the circuit board of the present invention can also be obtained, for example, by forming protruding electrodes without adding an additive to the protruding electrode paste; continuously applying a protective layer forming paste across a boundary between the lateral surface of the protruding electrode and the surface of the ceramic substrate; and firing.

Preferably, the protective layer forming paste contains at least one metal element selected from the group consisting of Al, Zr, Ti, Si, Zn, and Mg. More preferably, the protective layer forming paste contains at least one of $SiO_2$ or $Al_2O_3$.

A preferred composition of the protective layer is the same as described above, regardless of the method of forming the protective layer.

EXAMPLES

Examples that more specifically disclose the circuit board of the present invention are described below. The present invention is not limited to these examples.

Example 1

(Production of Ceramic Green Sheet)

BaO, $Al_2O_3$, and $SiO_2$ were mixed to obtain a predetermined composition, followed by calcination at 800° C. to 1000° C. The obtained calcinated powder was pulverized for 12 hours in a zirconia ball mill, whereby a ceramic powder was obtained.

Next, an organic solvent containing toluene and ethanol was added to the ceramic powder and mixed. Then, a binder and a plasticizer were further added thereto, and the mixture was mixed again, whereby a slurry was obtained.

The slurry was molded by the doctor blade method, whereby a ceramic green sheet having a thickness of 50 μm was produced.

(Production of Constraining Layer Sheet)

An alumina powder (0.5 μm to 5.0 μm) was mixed with an acrylic binder to obtain a slurry. Next, the slurry was molded by the doctor blade method, whereby a constraining layer sheet having a thickness of 100 μm was obtained.

(Production of Protruding Electrode Paste)

A Cu powder (86.6 parts) as a metal powder, a binder (11.0 parts), and an additive A (2.4 parts) shown in Table 1 were mixed, and the mixture was dispersed with a triple roll mill, whereby a protruding electrode paste was obtained. The binder was a terpineol solvent-based binder containing an ethyl cellulose resin.

TABLE 1

| | Additive |
|---|---|
| A | $SiO_2$—$B_2O_3$—$K_2O$-based glass |
| B | $SiO_2$—BaO—$Al_2O_3$—$TiO_2$-based glass |
| C | $SiO_2$—BaO—CaO—SrO-based glass |
| D | $SiO_2$—$B_2O_3$—$Al_2O_3$—CaO—SrO-based glass |
| E | $Al_2O_3$—CaO—$SiO_2$—MgO—$B_2O_3$-based glass |
| F | $SiO_2$—$B_2O_3$—$K_2O$—ZrO-based glass |
| G | $SiO_2$—$B_2O_3$—ZnO—$Al_2O_3$-based glass |

(Forming Hole in Constraining Layer Sheet and Filling the Hole with Protruding Electrode Paste)

Holes each having a diameter of 230 μm were formed by the laser processing in the constraining layer sheet, and the holes were filled with the protruding electrode paste, whereby a constraining layer sheet filled with the protruding electrode paste was obtained.

(Stacking and Pressure Bonding)

Two constraining layer sheets each filled with the protruding electrode paste were stacked on and pressure-bonded to an outermost layer of the ceramic green sheet laminate of the ceramic green sheets, whereby a laminate was obtained.
(Firing)

The laminate was fired at a maximum temperature of 930° C. to 1000° C., whereby a fired body was obtained. In firing, the atmosphere of the firing furnace was controlled using $N_2/H_2/H_2O$ to achieve an oxygen concentration at which no oxidation of copper occurs.

(Removal of Constraining Layer Sheets)

Using a washing liquid containing alumina abrasive grains (average particle size: 20 μm) and water (amount of alumina abrasive grains: 18 wt %), the fired body was washed for three minutes to remove the constraining layer sheets, whereby a fired body having protruding electrodes formed thereon was obtained.

(Sealing by Mold Resin)

The surface (on the side with the protruding electrodes) of the resulting ceramic substrate was sealed with a mold resin, and the surface of the mold resin was ground to expose a top surface of each protruding electrode. Subsequently, a plating film was formed by plating on the top surface of each protruding electrode, whereby a circuit board according to Example 1 was obtained.

Another circuit board was also produced in which the surface of the ceramic substrate was not sealed with a mold resin. The circuit board without sealing with a mold resin was used for measurement of the separation strength (described later).

Examples 2 to 14 and Comparative Example 1

Circuit boards according to Examples 2 to 14 and Comparative Example 1 were produced by the same procedure as in Example 1, except that the composition of the protruding electrode paste and the type of the additive were changed as shown in Table 2. The washing conditions for removing the constraining layer sheets were the same as in Example 1.

TABLE 2

| | | Composition of protruding electrode paste | | |
| | Additive | Additive [wt %] | Metal powder [wt %] | Binder [wt %] |
| --- | --- | --- | --- | --- |
| Example 1 | A | 2.4 | 86.6 | 11.0 |
| Example 2 | B | 3.6 | 85.5 | 10.9 |
| Example 3 | C | 3.3 | 85.8 | 10.9 |
| Example 4 | D | 3.3 | 85.8 | 10.9 |
| Example 5 | E | 3.3 | 85.8 | 10.9 |
| Example 6 | F | 3.3 | 85.8 | 10.9 |
| Example 7 | G | 3.3 | 85.8 | 10.9 |
| Example 8 | B | 1.2 | 88.4 | 10.4 |
| Example 9 | B | 0.9 | 88.8 | 10.3 |
| Example 10 | B | 0.5 | 89.5 | 10.0 |
| Example 11 | B | 10 | 82.5 | 7.5 |
| Example 12 | B | 0.4 | 89.3 | 10.3 |
| Example 13 | B | 0.4 | 89.4 | 10.2 |
| Example 14 | B | 0.3 | 89.3 | 10.4 |
| Comparative Example 1 | — | 0 | 89.8 | 10.2 |

(Measurement of Thickness, Height, and Coverage Rate of Protective Layer)

In each of the circuit boards of Examples 1 to 14 and Comparative Example 1, the surface was ground or cut to expose a predetermined cross section, and the thickness, height, and coverage rate of the protective layer were measured. Table 3 shows the results.

(Measurement of Bonding Strength)

The bonding strength was measured by the following method, using the circuit board with no covering on the surface of the ceramic substrate with a mold resin.

Using a universal bond tester 4000 Plus (available from Nordson Advanced Technology), the bonding strength between the protruding electrodes and the substrate was measured. The tip end of the tool was moved toward each protruding electrode at a constant speed, and the force at which the protruding electrode was separated from the ceramic substrate was measured as the bonding strength. The load cell was BS 5 kg. The tool size was 300 μm. The tool speed was 50 μm/s. The height was 50 μm. The protruding electrodes used for the measurement of the bonding strength each had a cylindrical shape with a height of 200 μm and a diameter of 230 μm. The bonding strength measured was evaluated by the following criteria.

Excellent: The bonding strength is higher than 3.5 N, exhibiting a particularly excellent effect of preventing or reducing separation and cracking.

Good: The bonding strength is higher than 2.5 N and 3.5 N or lower, exhibiting an excellent effect of preventing or reducing separation and cracking.

Fair: The bonding strength is higher than 2.0 N and 2.5 N or lower, exhibiting an effect of preventing or reducing separation and cracking.

Poor: The bonding strength is 2.0 N or lower, incapable of preventing or reducing separation and cracking.

TABLE 3

| | Protective layer | | | Bonding strength [N] | Evaluation |
| | Thickness [μm] | Height [μm] | Coverage rate [%] | | |
| --- | --- | --- | --- | --- | --- |
| Example 1 | 11 | 93 | 100 | 3.5 | Good |
| Example 2 | 13 | 77 | 100 | 4.6 | Excellent |
| Example 3 | 10 | 40 | 90 | 3.1 | Good |
| Example 4 | 15 | 95 | 100 | 4.8 | Excellent |
| Example 5 | 15 | 85 | 100 | 4.9 | Excellent |
| Example 6 | 10 | 90 | 100 | 3.6 | Excellent |
| Example 7 | 12 | 80 | 100 | 3.6 | Excellent |
| Example 8 | 10 | 18 | 60 | 3.7 | Excellent |
| Example 9 | 14 | 22 | 50 | 3.6 | Excellent |
| Example 10 | 10 | 15 | 50 | 2.8 | Good |
| Example 11 | 25 | 95 | 100 | 4.9 | Excellent |
| Example 12 | 8 | 18 | 50 | 2.5 | Fair |
| Example 13 | 7 | 19 | 50 | 2.5 | Fair |
| Example 14 | 5 | 5 | 20 | 2.3 | Fair |
| Comparative Example 1 | 0 | 0 | 0 | 1.7 | Poor |

According to the results in Table 3, the circuit board of each Example exhibited a high bonding strength between the protruding electrodes and the ceramic substrate so that cracking and separation were less likely to occur.

The comparison between Examples 1 to 11 and Examples 12 to 14 found that the bonding strength further increases when the protective layer meets all the following three conditions: a thickness of 10 μm or more, a height of 15 μm or more, and a coverage rate of 50% or more.

REFERENCE SIGNS LIST

1, 2 circuit board
10 ceramic substrate
10a surface of ceramic substrate
20, 21, 22, 23, 24, 25, 26 protruding electrode
20a, 21a, 22a, 23a, 24a, 25a, 26a lateral surface of protruding electrode 20b top surface of protruding electrode
30, 31, 31a, 31b, 32, 33, 34, 35, 36 protective layer
50 mold resin
60 plating film
111, 112, 113 insulating layer
120 internal wiring line
130 via conductor
200 constraining layer sheet
201 through hole
210 ceramic green sheet laminate
211, 212, 213 ceramic green sheet
220 conductive paste to be formed into internal wiring line
230 conductive paste to be formed into via conductor
240 protruding electrode paste
300 laminate
b boundary between lateral surface of protruding electrode and ceramic substrate
$C_1$ center of gravity of protruding electrode
h height of protective layer
$h_r$ reference height
$l_1$ length of one side of square
$l_2, l_3, l_4, l_5$ length of protective layer
t thickness of protective layer

The invention claimed is:

1. A circuit board comprising: a ceramic substrate; a protruding electrode on a surface of the ceramic substrate, wherein the protruding electrode has a height of 50 μm to 300 μm, and a diameter of 100 μm to 300 μm; and a protective layer containing a metal oxide and covering at least a portion of a lateral surface of the protruding electrode and extending continuously across a boundary between the portion of the lateral surface of the protruding electrode and the surface of the ceramic substrate, wherein the protective layer has a thickness of 10 μm or more, a height of 15 μm or more from the surface of the ceramic substrate, and a coverage rate of 50% or more on the lateral surface of the protruding electrode.

2. The circuit board according to claim 1, wherein the protruding electrode has an aspect ratio of 0.5 to 1.5.

3. The circuit board according to claim 1, wherein the metal oxide is $SiO_2$ and is a main component of the protective layer.

4. The circuit board according to claim 1, wherein the metal oxide contains at least one metal element selected from the group consisting of Al, Zr, Ti, Si, Zn, and Mg.

5. The circuit board according to claim 1, wherein the metal oxide contains $SiO_2$.

6. The circuit board according to claim 1, wherein the protective layer contains a ceramic material of the ceramic substrate.

7. The circuit board according to claim 1, wherein the protruding electrode contains at least one metal selected from the group consisting of Cu, Ag, and Ni.

8. The circuit board according to claim 1, wherein the protruding electrode contains at least one metal selected from the group consisting of Cu, Ag, Al, Fe, Cr, Ni, Au and alloys thereof.

9. The circuit board according to claim 1, wherein the protruding electrode contains a sintered metal.

10. The circuit board according to claim 1, wherein at least a portion of the surface of the ceramic substrate on which the protruding electrode is located is covered with a mold resin.

11. The circuit board according to claim 10, wherein a height of the mold resin is a same height as the protruding electrode.

12. The circuit board according to claim 10, further comprising a plating film on a top surface of each protruding electrode and protruding from the mold resin.

13. The circuit board according to claim 1, wherein the protruding electrode has a square cross-sectional shape.

14. The circuit board according to claim 1, wherein the protective layer entirely covers the lateral surface of the protruding electrode when seen in a top view.

* * * * *